(12) United States Patent
Park et al.

(10) Patent No.: US 11,371,696 B2
(45) Date of Patent: Jun. 28, 2022

(54) SYSTEM AND METHOD FOR CONFIGURING BOILER COMBUSTION MODEL

(71) Applicant: DOOSAN HEAVY INDUSTRIES & CONSTRUCTION CO., LTD., Changwon-si (KR)

(72) Inventors: Jee Hun Park, Gwangmyeong-si (KR); Sang Gun Na, Yongin-si (KR); Hyun Sik Kim, Gimpo-si (KR)

(73) Assignee: Doosan Heavy Industries & Construction Co., Ltd, Changwon-si (KR)

( * ) Notice: Subject to any disclaimer, the term of this patent is extended or adjusted under 35 U.S.C. 154(b) by 402 days.

(21) Appl. No.: 16/708,353

(22) Filed: Dec. 9, 2019

(65) Prior Publication Data
US 2020/0191380 A1    Jun. 18, 2020

(30) Foreign Application Priority Data

Dec. 17, 2018    (KR) .................. 10-2018-0163258

(51) Int. Cl.
| | |
|---|---|
| F22B 35/18 | (2006.01) |
| G05B 13/04 | (2006.01) |
| G06F 17/15 | (2006.01) |
| G06F 30/17 | (2020.01) |
| G06F 30/20 | (2020.01) |

(52) U.S. Cl.
CPC ............ *F22B 35/18* (2013.01); *G05B 13/047* (2013.01); *G06F 17/15* (2013.01); *G06F 30/17* (2020.01); *G06F 30/20* (2020.01)

(58) Field of Classification Search
CPC ....... F22B 35/18; G05B 13/047; G06F 17/15; G06F 30/17; G06F 30/20; G06F 30/27; G06F 17/11; F23N 2227/12; F01K 13/006
See application file for complete search history.

(56) References Cited

U.S. PATENT DOCUMENTS

2017/0017212 A1\*    1/2017    Collins ................ G05B 13/027

FOREIGN PATENT DOCUMENTS

| KR | 1020160094811 A | 8/2016 |
|---|---|---|
| KR | 101684348 B1 | 12/2016 |
| KR | 1020170038952 A | 4/2017 |
| KR | 101810968 B1 | 12/2017 |

\* cited by examiner

*Primary Examiner* — Tejal Gami
(74) *Attorney, Agent, or Firm* — Invenstone Patent, LLC

(57) ABSTRACT

A system and method for configuring a boiler combustion model are provided. The system for configuring the boiler combustion model may include a model generator configured to generate the boiler combustion model using, as input/output data, data obtained based on measured data, analysis data, and controller information, a model simulator configured to simulate the generated boiler combustion model and output simulated results, and a model modifier configured to evaluate the boiler combustion model based on the simulated results and generate modification information for modifying the boiler combustion model based on the generated boiler combustion model and corresponding evaluated results.

20 Claims, 5 Drawing Sheets

[FIG. 1]
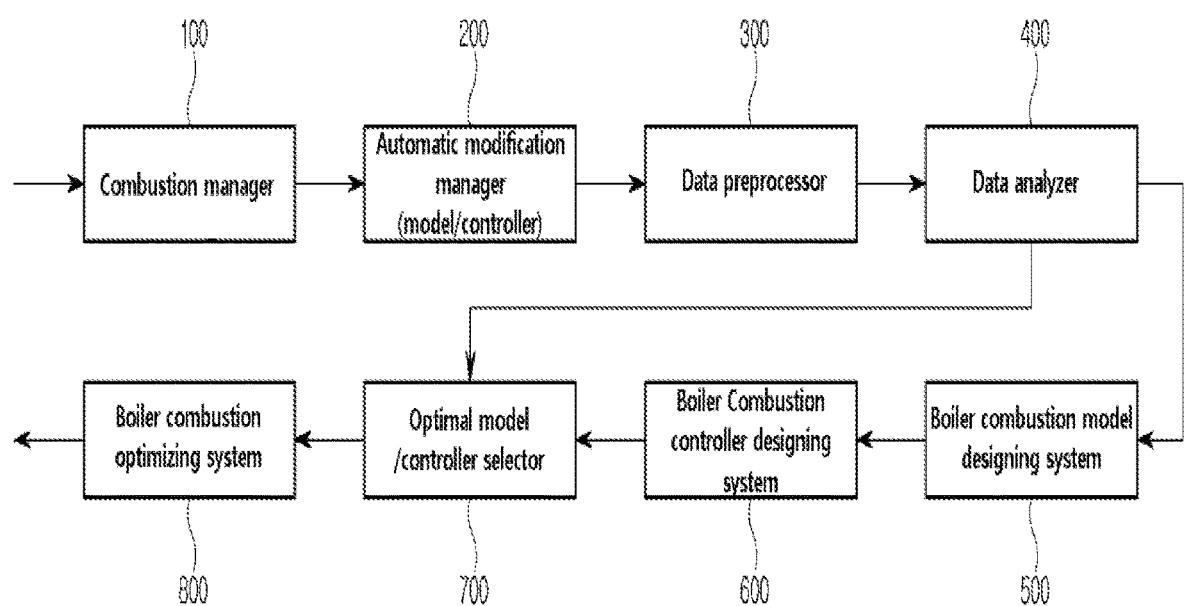

[FIG. 2]
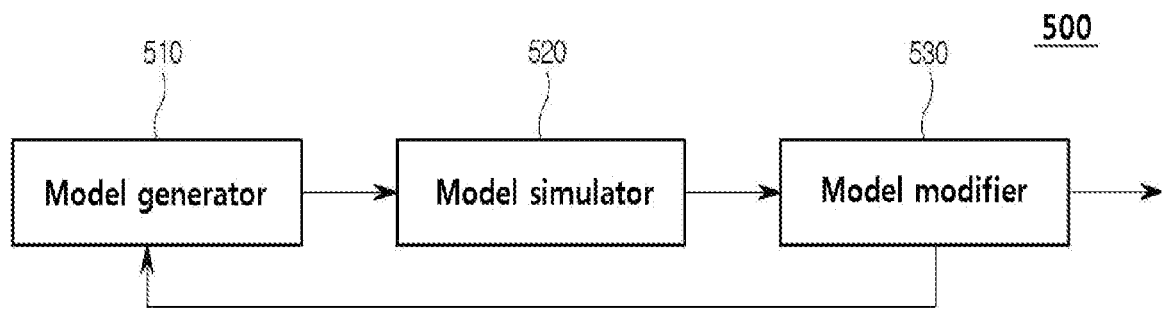

[FIG. 3]
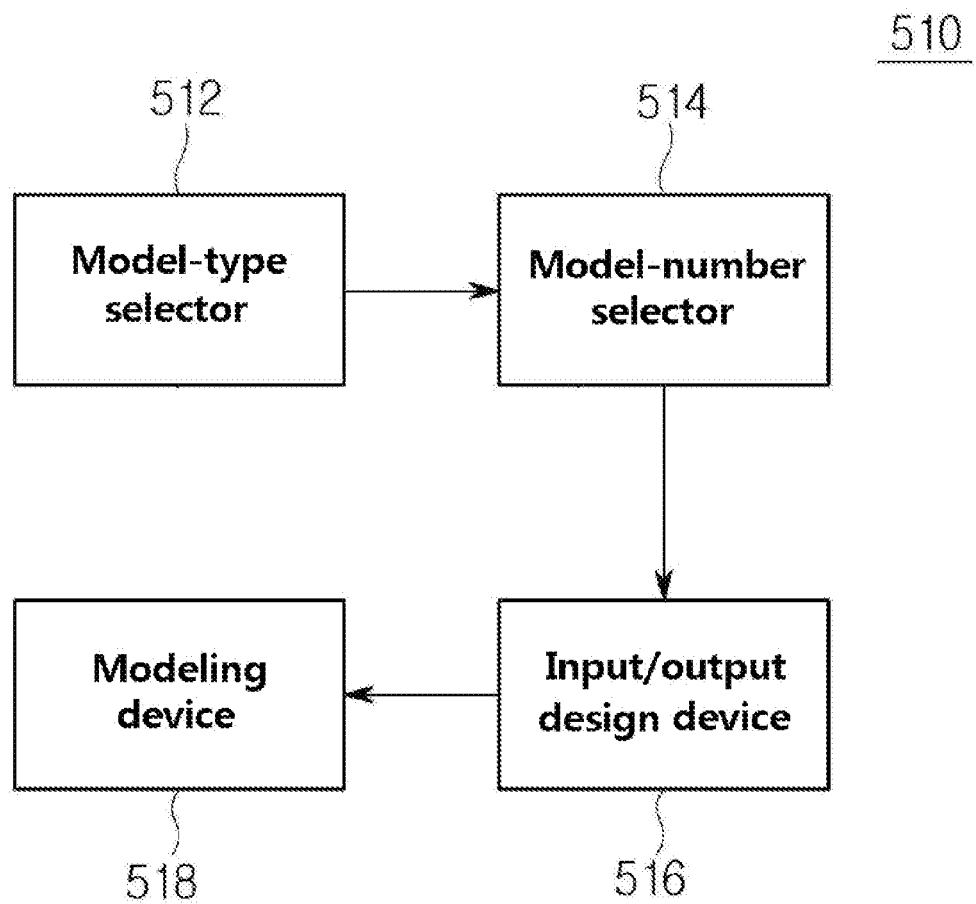

[FIG. 4]
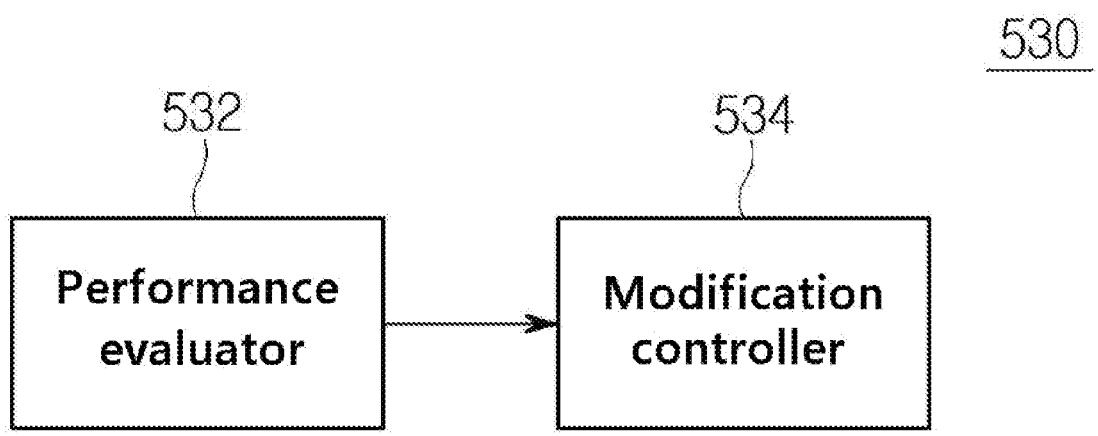

[FIG. 5]
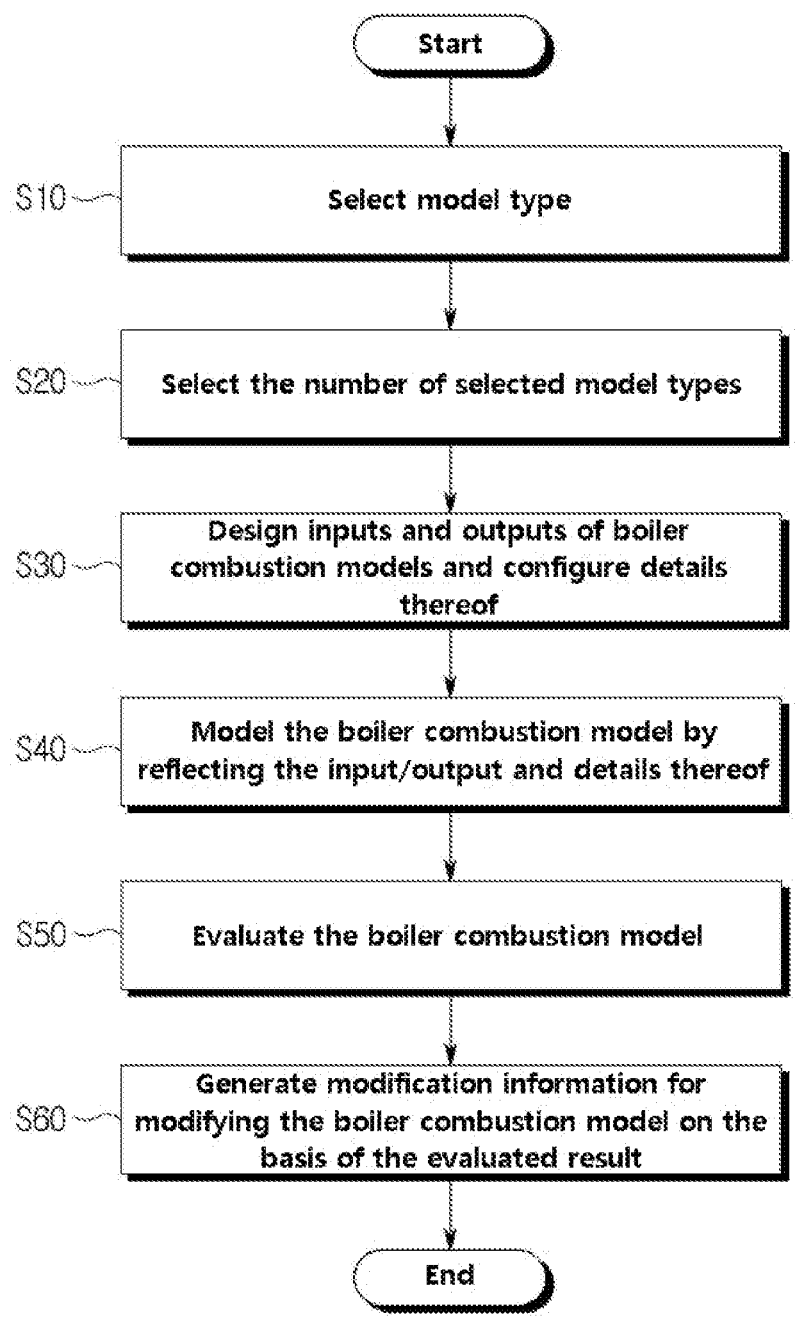

SYSTEM AND METHOD FOR CONFIGURING BOILER COMBUSTION MODEL

CROSS REFERENCE TO RELATED APPLICATION

This application claims priority to Korean Patent Application No. 10-2018-0163258, Filed on Dec. 17, 2018, the entire disclosure of which is incorporated herein by reference in its entirety.

BACKGROUND

1. Field

Apparatuses and methods consistent with exemplary embodiments relate to a system and method for configuring a boiler combustion model and, more particularly, to a system and method for configuring a boiler combustion model by designing a model type, number, input/output, etc. to configure the boiler combustion model, verifying the boiler combustion model, and incorporating the verified results into the boiler combustion model.

2. Description of the Related Art

Boilers in coal-fired power plants use exothermic reactions from coal burning to heat water and produce steam for power generation. At this time, pollution exhaust gases such as nitrogen oxides are generated. When the amount of the pollution exhaust gas increases, the cost for treating the pollution exhaust gas increases. Furthermore, when the combustion of coal is incomplete combustion, the combustion efficiency is reduced, thereby increasing the power generation/operation cost. Therefore, there is a need for a boiler combustion optimization system for reducing pollution exhaust gas while increasing combustion efficiency, and a system for constructing a boiler combustion model for this purpose is also required.

SUMMARY

Aspects of one or more exemplary embodiments provide a system and method for configuring a boiler combustion model by designing a model type, number, input/output, etc. to configure the boiler combustion model, verifying the boiler combustion model, and incorporating the verified results into the boiler combustion model.

Additional aspects will be set forth in part in the description which follows and, in part, will become apparent from the description, or may be learned by practice of the exemplary embodiments.

According to an aspect of an exemplary embodiment, there is provided a system for configuring a boiler combustion model, the system including: a model generator configured to generate a boiler combustion model using, as input/output data, data obtained based on measured data, analysis data, and controller information; a model simulator configured to simulate the generated boiler combustion model and output simulated results; and a model modifier configured to evaluate the boiler combustion model based on the simulated results and generate modification information for modifying the boiler combustion model based on the generated boiler combustion model and corresponding evaluated results.

The model generator may generate the boiler combustion model according to the modification information generated by the model modifier.

The model generator may include a model-type selector configured to select a model type, a model-number selector configured to select the number of models having the model type selected by the model-type selector, an input/output design device configured to design inputs and outputs of the boiler combustion models and configure details of the inputs and outputs, and a modeling device configured to model the boiler combustion model in response to the designed inputs and outputs.

The model-type selector may select at least one of an auto-regressive eXogeneous (ARX) model, a nonlinear ARX (NARX) model, a finite impulse response (FIR) model, an auto-regressive moving average eXogeneous (ARMAX) model, a neural network (NN) model, a state space model including a linear time invariant (LTI) state space model, a discrete & delay time state space model, and a multi input multi output (MIMO) state space model, an impulse response model, a step response model, and a frequency transfer function model.

The model-type selector may select the state space model as a basic model, and select the discrete & delay time state space model, in which delay time is considered, together with the ARX model to improve the model and control performance.

The input/output design device may design input/output for each output and model through tag analysis.

The boiler combustion model reflecting the input and output may follow Equation 1, $$x_3(k) = a_1 x_1(k-d_1)^{b_1} + a_2 x_2(k-d_2)^{b_2} + c \qquad \text{Equation 1}$$

where $x_3(k)$ is an output value, $x_1$, $x_2$ are an input value, and $a_1$, $a_2$, k, $d_1$, $d_2$, $b_1$, $b_2$, and c are constants, wherein the input/output design device designs the constants of $a_1$, $a_2$, k, $d_1$, $d_2$, $b_1$, $b_2$, and c.

The model modifier may include a performance evaluator configured to evaluate the boiler combustion model based on an output value of the boiler combustion model, and a modification controller configured to generate modification information for modifying the boiler combustion model based on the evaluated result by the performance evaluator.

According to an aspect of another exemplary embodiment, there is provided a method of configuring a boiler combustion model, the method including: generating a boiler combustion model using, as input/output data, data obtained based on measured data, analyzed data, and controller information; simulating the generated boiler combustion model and outputting simulated results; and evaluating the boiler combustion model based on the simulated results and generating modification information for modifying the boiler combustion model based on the generated boiler combustion model and corresponding evaluated results.

The generating the boiler combustion model may include generating the boiler combustion model according to the generated modification information.

The generating the boiler combustion model may include selecting a model type, selecting the number of models having the selected model type, designing inputs and outputs of the boiler combustion models and configuring details of the inputs and outputs, and modeling the boiler combustion model in response to the designed inputs and outputs.

The selecting the model type may include selecting at least one of an auto-regressive eXogeneous (ARX) model, a nonlinear ARX (NARX) model, a finite impulse response (FIR) model, an auto-regressive moving average eXogeneous (ARMAX) model, a neural network (NN) model, a state space model including a linear time invariant (LTI) state space model, a discrete & delay time state space model, and a multi input multi output (MIMO) state space model, an impulse response model, a step response model, and a frequency transfer function model.

The selecting the model type may include selecting the state space model as a basic model, and selecting the discrete & delay time state space model, in which delay time is considered, together with the ARX model to improve the model and control performance.

The designing inputs and outputs of the boiler combustion models may include designing the input/output for each output and model through tag analysis.

The boiler combustion model reflecting the input and output may follow Equation 1, $$x_3(k)=a_1x_1(k-d_1)^{b_1}+a_2x_2(k-d_2)^{b_2}+c \qquad \text{Equation 1}$$

where $x_3(k)$ is an output value, $x_1$, $x_2$ are an input value, and $a_1$, $a_2$, k, $d_1$, $d_2$, $b_1$, $b_2$, and c are constants, wherein the input/output design device designs the constants of $a_1$, $a_2$, k, $d_1$, $d_2$, $b_1$, $b_2$, and c.

The generating the modification information may include evaluating the boiler combustion model based on an output value of the boiler combustion model, and generating modification information for modifying the boiler combustion model based on the evaluated result.

According to an aspect of another exemplary embodiment, there is provided a non-transitory computer readable storage medium storing a computer program comprising instructions for performing the method of configuring the boiler combustion model.

According to an aspect of another exemplary embodiment, there is provided a system for optimizing a boiler combustion, the system including: an automatic modification manager configured to determine a combustion model and a combustion controller based on tag data information measured in real time, determine whether to perform combustion optimization, and determine whether to perform learning for modifying the combustion model and the combustion controller; a data preprocessor configured to perform data preprocessing using the tag data information and data information of a tag previously stored; a data analyzer configured to perform sampling to select data required for design of the combustion model and the combustion controller through pattern analysis of the data, and select an input variable through correlation analysis for the design of the combustion model; a boiler combustion model designing system configured to design the combustion model based on an input of fuel input, an air input, an air temperature, a water input, or an air temperature; a boiler combustion controller designing system configured to design the combustion controller using the combustion model to generate an optimal target value for optimal combustion control; an optimal model/controller selector configured to select the most optimal combustion model and the combustion controller from a plurality of existing combustion models and combustion controllers obtained based on an analysis result of current data; and a boiler combustion optimizing system configured to calculate the optimal target value by inputting the current data to the optimal combustion model and the combustion controller.

The automatic modification manager may execute the boiler combustion model designing system and the boiler combustion controller designing system in response to determining that the combustion model and the combustion controller are required to be modified.

The boiler combustion model designing system may include a model generator configured to generate the boiler combustion model using, as input/output data, data obtained based on measured data, analysis data, and controller information, a model simulator configured to simulate the generated boiler combustion model and output simulated results, and a model modifier configured to evaluate the boiler combustion model based on the simulated results and generate modification information for modifying the boiler combustion model based on the generated boiler combustion model and corresponding evaluated results.

According to one or more exemplary embodiments, more accurate and stable boiler combustion model can be obtained by verifying the modeled boiler combustion model.

BRIEF DESCRIPTION OF THE DRAWINGS

The above and other aspects will be more apparent from the following description of the exemplary embodiments with reference to the accompanying drawings, in which:

FIG. 1 is a block diagram illustrating a boiler combustion optimization system for optimizing boiler combustion according to an exemplary embodiment;

FIG. 2 is a block diagram illustrating a configuration of a boiler combustion model designing system according to an exemplary embodiment;

FIG. 3 is a block diagram illustrating a configuration of a model generator according to an exemplary embodiment;

FIG. 4 is a block diagram illustrating a configuration of a model modifier according to an exemplary embodiment; and FIG. 5 is a flowchart illustrating a boiler combustion model configuration method according to an exemplary embodiment.

DETAILED DESCRIPTION

Various modifications and various embodiments will be described in detail with reference to the accompanying drawings so that those skilled in the art may easily implement the disclosure. It should be understood, however, that the various embodiments are not for limiting the scope of the disclosure to the specific embodiment, but they should be interpreted to include all modifications, equivalents, and alternatives of the embodiments included within the spirit and scope disclosed herein.

The functional blocks illustrated in the drawings and described below are only examples of possible implementations. Other functional blocks may be used in other implementations without departing from the spirit and scope of the detailed description. Also, while one or more functional blocks of the present disclosure are represented by separate blocks, one or more of the functional blocks may be a combination of various hardware and software configurations that perform the same function.

Also, "a module" or "a part" in the disclosure perform at least one function or operation, and these elements may be implemented as hardware or software, or as a combination of hardware and software. Further, a plurality of "modules" or "parts" may be integrated into at least one module and implemented as at least one processor, except "modules" or "parts" that need to be implemented as specific hardware.

The terminology used herein is for the purpose of describing specific embodiments only and is not intended to limit the scope of the disclosure. The singular expressions "a", "an", and "the" are intended to include the plural expressions as well, unless the context clearly indicates otherwise. When an element is referred to as being "on" another element, it can be directly on the other element or intervening elements may be present therebetween.

In the disclosure, the terms such as "comprise", "include", "have/has" should be construed as designating that there are such features, regions, integers, steps, operations, elements, components, and/or combinations thereof, not to exclude the presence or possibility of adding of one or more of other features, regions, integers, steps, operations, elements, components, and/or combinations thereof.

Further, terms such as "first," "second," and so on may be used to describe a variety of elements, but the elements should not be limited by these terms. The terms are used simply to distinguish one element from other elements. The use of such ordinal numbers should not be construed as limiting the meaning of the term. For example, the components associated with such an ordinal number should not be limited in the order of use, placement order, or the like. If necessary, each ordinal number may be used interchangeably.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

Hereinbelow, exemplary embodiments will be described in detail with reference to the accompanying drawings. In order to clearly illustrate the disclosure in the drawings, some of the elements that are not essential to the complete understanding of the disclosure may be omitted, and like reference numerals refer to like elements throughout the specification.

FIG. 1 is a block diagram illustrating a boiler combustion optimization system for optimizing boiler combustion according to an exemplary embodiment.

Referring to FIG. 1, the boiler combustion optimization system may include a combustion manager 100, an automatic modification manager 200, a data preprocessor 300, a data analyzer 400, a boiler combustion model designing system 500, a boiler combustion controller designing system 600, an optimal model/controller selector 700, and a boiler combustion optimizing system 800.

The combustion manager 100 may be configured to comprehensively manage combustion optimization. For example, the combustion manager 100 may determine whether to perform combustion optimization based on tag data information measured or calculated in real time. In addition, when used in a power plant, the combustion manager 100 may determine whether to perform combustion optimization based on distributed control system (DCS) values such as a power output, an output change state, a chute blower operation, a boiler logic operation, and the like.

The automatic modification manager 200 may be configured to manage a combustion model and a combustion controller. For example, the automatic modification manager 200 may determine the combustion model and the combustion controller based on information such as tag data information measured or calculated in real time. Further, the automatic modification manager 200 may determine whether to perform the combustion optimization, and determine whether to perform learning for modifying the model and the controller. Here, the automatic modification manager 200 executes the boiler combustion model designing system 500 and the boiler combustion controller designing system 600 if it is determined that the combustion model and the combustion controller are required to be modified. However, the automatic modification manager 200 does not execute the boiler combustion model designing system 500 and the boiler combustion controller designing system 600 if it is determined that the combustion model and the combustion controller are not required to be modified.

The data preprocessor 300 may be configured to perform data preprocessing using tag data information measured or calculated in real time and data information of a tag previously stored. For example, the data preprocessor 300 may perform signal processing, normal data processing (based on knowledge or data), outlier processing, or the like. Then, the data preprocessor 300 may remove data that may adversely affect the removal of noise in the data, the generation of the combustion model, and the design of the controller.

The data analyzer 400 may be configured to perform sampling to select only important data in a steady state required for the design of the combustion model and the combustion controller through pattern analysis of the data. Further, the data analyzer 400 may select an input variable that has a significant influence on the model output variable through correlation analysis for the design of the combustion model.

The boiler combustion model designing system 500 may be an algorithm for designing a combustion model which is one of the most important factors for optimizing boiler combustion. The boiler combustion model designing system 500 may design the combustion model that can predict important factors for combustion such as a power output, a combustion state including temperature of steam and exhaust gases, a composition of exhaust gas, residual oxygen after combustion, or the like based on the input of fuel input, air input, air temperature, water input, air temperature, etc.

The boiler combustion controller designing system 600 may be an algorithm for designing a combustion controller which is one of the most important factors for optimizing boiler combustion. The boiler combustion controller designing system 600 may allow the combustion controller designed using a combustion model to generate an optimal target value for optimal combustion control.

The optimal model/controller selector 700 may be configured to select the most optimal combustion model and the combustion controller from a plurality of existing combustion models and combustion controllers obtained based on the analysis result of the current data.

The boiler combustion optimizing system 800 may be configured to calculate the optimal target value for the combustion optimization by inputting the current data to the optimal combustion model and the combustion controller. In addition, the boiler combustion optimizing system 800 may calculate an optimal control target value or an associated auxiliary value by using a target value and a manual in the current DCS.

Here, the optimum boiler combustion model design system corresponds to the boiler combustion model designing system 500, which configures a more accurate and stable boiler combustion model by selecting the type, number, etc. of the boiler combustion model to model the boiler combustion model, verifying the modeled boiler combustion model, and modifying the boiler combustion model based on the verified results.

FIG. 2 is a block diagram illustrating a configuration of a boiler combustion model designing system according to an exemplary embodiment.

Referring to FIG. 2, the boiler combustion model designing system 500 may include a model generator 510, a model simulator 520, and a model modifier 530. The model generator 510, the model simulator 520, and the model modifier 530 can be implemented as one or more processor configured to perform corresponding functions. For example, the one or more processor may be a CPU (central processing unit), MPU (micro processing unit), FPGA (field programmable gate array), MCU (micro controller unit), GPU (graphics processing unit), or ASIC (application specific integrated circuit), but not limited thereto.

The model generator 510 may be configured to generate a boiler combustion model using, as input and output data, data obtained based on measured data, analysis data, and controller information. Here, the measured data refers to data measured during boiler combustion (i.e., before, during, and after boiler combustion) as data measured in the boiler. For example, it may be data required or set for boiler combustion, or data output according to a boiler combustion result.

Here, data required or set for boiler combustion may include coal flow, feed water flow/temperature/pressure, air flow/temperature/pressure, SA damper position, Overfire Air (OFA) damper position, duct flue gas damper position, unit load dictator (ULD) set point, windbox differential pressure, flue gas middle temperature/flow, main stream flow/temperature/pressure, flame status, or RH spray flow. Data output according to the boiler combustion result may include windbox differential pressure, flue gas middle temperature/flow, main stream flow/temperature/pressure, flame status, RH spray flow, boiler load, plant load, flue gas temperature/flow, flue gas $NO_x$, flue gas CO, or flue gas $O_2$.

In addition, the analysis data is data obtained by analyzing the data measured in the boiler, and may include a data pattern, a power generation output change, an efficiency status, an operation status, and the like.

Further, the controller information may be a control target value or related auxiliary value for combustion optimization using the data analysis result and the combustion model. For example, the controller information may be information such as a controller type (e.g., proportional-integral-derivative control, model prediction control, fuzzy control, adaptive control, etc.), a control gain, a control delay time, and the like.

The model generator 510 may generate a boiler combustion model based on the data. Here, types of boiler combustion models may be at least one of a transfer function model type, a state space model type, and an impulse/step response model type.

The model simulator 520 may simulate the boiler combustion model and output a simulated result. For example, the model simulator 520 may simulate the operation of the boiler combustion model during boiler combustion (i.e., before, during, and after boiler combustion).

The model modifier 530 may evaluate the boiler combustion model based on the simulated results of the boiler combustion model by the model simulator 520, and generate modification information for modifying (or correcting) the boiler combustion model based on the generated boiler combustion model and the corresponding evaluated result. The model modifier 530 may evaluate the boiler combustion model by determining whether an output value of the boiler combustion model matches an actual output value output during boiler combustion.

Further, the model modifier 530 may generate modification information based on the evaluated result of the boiler combustion model. Here, the modification information may be information that allows the boiler combustion model to be more similar to actual data obtained during boiler combustion. The model generator 510 may generate a new boiler combustion model or modify the generated boiler combustion model by reflecting the modification information generated by the model modifier 530.

FIG. 3 is a block diagram illustrating a configuration of a model generator according to an exemplary embodiment.

Referring to FIG. 3, the model generator 510 may include a model-type selector 512, a model-number selector 514, an input/output design device 516, and a modeling device 518.

The model-type selector 512 may be configured to select a model type. Here, the model type may be at least one of a transfer function model type, a state space model type, and an impulse/step response model type.

For example, the transfer function model may include an auto-regressive eXogeneous (ARX) model, a nonlinear ARX (NARX) model, a finite impulse response (FIR) model, an auto-regressive moving average eXogeneous (ARMAX) model, and a neural network (NN) model. The transfer function model may be a result-considered model, which may be excellent in performance and operable in a nonlinear type.

In addition, the neural network (NN) model may include an FF, FB, radial basis function NN model, a convolutional spiking NN model, a deep belief network (DBN) model, and a recurrent NN (RNN) model. The NN model is a model that may be used when model structure design is difficult.

Further, the state space model may include a linear time invariant (LTI) state space model, a discrete & delay time state space model, and a multi input multi output (MIMO) state space model. The state space model is a model that considers both the process and the result, and has the best performance among other control models. Also, the state space model has excellent scalability to LTI and MIMO systems and may handle both unstable and closed loop systems.

In addition, the impulse/step response model may include an impulse response model, a step response model, and a frequency transfer function model. The impulse/step response model is a frequency analysis-based model that facilitates model analysis.

The model-number selector 514 may be configured to select the number of model types selected by the model-type selector 512. The model-number selection unit 514 may select how many model types, which are selected by the model-type selector 512, are configured in a model.

The input/output design device 516 may be configured to design inputs and outputs of a plurality of boiler combustion models and configure details of the inputs and outputs. For example, the input/output design device 516 may design input/output for each output and model through tag analysis. Input/output per model for each output and model may be designed for corresponding models selected by the model-number selector 514. In addition, the input/output design device 516 may design details of the input/output. Here, the details may be linearity/nonlinearity, exponent, delay time, and the like.

Here, the input/output design device 516 may design the input and output and details of the boiler combustion model such that when the modification information is transmitted from the model modifier 530, the input and output and details of the boiler combustion model are modified to reflect the modification information. The input/output design device 516 may design the boiler combustion model to be more consistent with the actual boiler combustion data by modifying at least one of the input and output and details based on the modification information.

The modeling device 518 may be configured to model the boiler combustion model by reflecting the input and output.

Here, the boiler combustion model reflecting the input and output may follow Equation 1 below.

$$x_3(k)=a_1x_1(k-d_1)^{b_1}+a_2x_2(k-d_2)^{b_2}+c \qquad \text{Equation 1}$$

where $x_3(k)$ may be an output value, $x_1$, $x_2$ may be an input value, and $a_1$, $a_2$, k, $d_1$, $d_2$, $b_1$, $b_2$, and c may be constants.

If the values of the input/output and the details change in the input/output design device 516 by the modification information, the modeling device 518 may newly model the combustion model according to the changed values. Accordingly, an optimal combustion model for boiler combustion may be configured.

FIG. 4 is a block diagram illustrating a configuration of a model modifier according to an exemplary embodiment.

Referring to FIG. 4, the model modifier 530 may include a performance evaluator 532 and a modification controller 534.

The performance evaluator 532 may be configured to evaluate the performance of the boiler combustion model and output the evaluated result. The performance evaluator 532 may evaluate the boiler combustion model based on the simulated result of the boiler combustion model by the model simulator 520. Here, the performance evaluator 532 may evaluate the boiler combustion model by determining whether an output value of the boiler combustion model matches an actual output value output during boiler combustion. In this case, the actual output value output during the boiler combustion may be stored in advance, but it is not limited thereto. For example, the actual output value may be measured and collected in real time.

The modification controller 534 may generate modification information for modifying the boiler combustion model based on a result of evaluating the performance of the boiler combustion model. The modification controller 534 may generate the modification information for improving (or modifying) the evaluated boiler combustion model based on the evaluated result transmitted from the performance evaluator 532, and transmit the generated modification information to the model generator 510.

The modification controller 534 may generate the modification information based on the evaluated result if the evaluated result is lower than a reference value, but may not generate the modification information if the evaluated result is equal to or greater than the reference value.

For example, the modification controller 534 may generate the modification information including information about the design (or generation) of the boiler combustion model so that the actual output value of the boiler combustion and the output value of the boiler combustion model may be matched as much as possible. Here, the modification information may include information for modifying a model type, the number of constituted models for each output, input/output tags, whether a model is a linear type or a nonlinear type, exponent, and delay time.

For example, the modification controller 534 may be both data-driven and domain-knowledge based, and may perform the modification using a genetic algorithm or an optimization algorithm such as Particle Swarm Optimization (PSO). Also, the modification controller 534 may use modification logic.

The modification information generated by the modification controller 534 may be transferred to the model generator 510, which may in turn generate a boiler combustion model by taking further account of the modification information. That is, the model generator 510 may modify the boiler combustion model by reflecting the modification information transmitted to the previously generated boiler combustion model. This may allow for a more accurate and stable boiler combustion model.

FIG. 5 is a flowchart illustrating a boiler combustion model configuration method according to an exemplary embodiment.

Referring to FIG. 5, the model-type selector 512 may be configured to select a model type (operation S10). Here, the model type may be at least one of a transfer function model type, a state space model type, and an impulse/step response model type.

For example, the transfer function model may include an auto-regressive eXogeneous (ARX) model, a nonlinear ARX (NARX) model, a finite impulse response (FIR) model, an auto-regressive moving average eXogeneous (ARMAX) model, and a neural network (NN) model. The neural network (NN) model may include an FF, FB, radial basis function NN model, a convolutional spiking NN model, a deep belief network (DBN) model, and a recurrent NN (RNN) model. The state space model may include a linear time invariant (LTI) state space model, a discrete & delay time state space model, and a multi input multi output (MIMO) state space model. The impulse/step response model may include an impulse response model, a step response model, and a frequency transfer function model.

Here, the model-type selector 512 may select the state space model as a basic model, and may select the discrete & delay time state space model in which delay time is considered to improve the model and control performance. In addition, the model-type selector 512 may select and examine the ARX model together among the classic control models.

The model-number selector 514 may be configured to select the number of model types selected by the model-type selector (operation S20). The model-number selector 514 may select how many model types, which are selected by the model-type selector 512, are configured in a model.

The input/output design device 516 may be configured to design inputs and outputs of a plurality of boiler combustion models and configure details of the inputs and outputs (operation S30). For example, the input/output design device 516 may design input/output for each output and model through tag analysis.

The modeling device 518 may be configured to model the boiler combustion model by reflecting the input and output (operation S40). Here, the boiler combustion model reflecting the input and output may follow Equation 1 below.

$$x_3(k)=a_1x_1(k-d_1)^{b_1}+a_2x_2(k-d_2)^{b_2}+c \qquad \text{Equation 1}$$

where $x_3(k)$ may be an output value, $x_1$, $x_2$ may be an input value, and $a_1$, $a_2$, k, $d_1$, $d_2$, $b_1$, $b_2$, and c may be constants.

The model simulator 520 may be configured to evaluate the boiler combustion model (operation S50). The model simulator 520 may simulate the boiler combustion model and output a simulated result.

The model modifier 530 may be configured to evaluate the boiler combustion model based on the simulated results of the boiler combustion model, and generate modification information for modifying the boiler combustion model (operation S60). For example, the model modifier 530 may evaluate the boiler combustion model by determining the degree of conformity between actual data during boiler combustion and simulated data of the boiler combustion model through comparison of the two data. In addition, the model modifier 530 may generate the modification information of the boiler combustion model based on the result of evaluating the boiler combustion model.

The modification information generated by the model modifier 530 may be transferred to the model generator 510, which may in turn modify input and output and details of the boiler combustion model by reflecting the modification information.

As described above, the apparatus and method for configuring a boiler combustion model may be implemented by designing a model type, number, input/output, etc. to configure the boiler combustion model, verifying the boiler combustion model, and incorporating the verified results into the boiler combustion model.

Meanwhile, various methods according to an exemplary embodiment described above can be implemented in the form of a readable program through various computer means and recorded in a computer-readable recording medium. Herein, the recording medium can include program commands, data files, data structures, etc. alone or in combination thereof. The program commands to be recorded on the recording medium can be those specially designed and constructed for the present disclosure or can also be those known and available to those skilled in the art of computer software. For example, the recording medium can be magnetic media such as hard disks, floppy disks, and magnetic tapes, optical media such as CD-ROMs and DVDs, magneto-optical media such as floptical disks, and hardware devices specially configured to store and execute the program commands such as ROMs, RAMs, and flash memory. Examples of the program commands can include not only machine language wires such as those produced by a compiler but also high-level language wires that can be executed by a computer by using an interpreter, etc. This hardware device can be configured to operate as one or more software modules in order to perform the operation of the present disclosure, and vice versa.

While exemplary embodiments have been described with reference to the accompanying drawings, it is to be understood by those skilled in the art that various modifications in form and details may be made therein without departing from the sprit and scope as defined by the appended claims. Therefore, the description of the exemplary embodiments should be construed in a descriptive sense and not to limit the scope of the claims, and many alternatives, modifications, and variations will be apparent to those skilled in the art.

What is claimed is:

1. A system for configuring a boiler combustion model, the system comprising:
a boiler of a power plant under operation, the power plant configured to generate input/output data based on measured data, analysis data, and combustion controller information, the measured data including data measured in the boiler and obtained before, during, and after boiler combustion, the analysis data obtained by analyzing the measured data in real time, the combustion controller information including controller type, control gain, control delay time, and a control target value for combustion optimization;
a model generator configured to generate the boiler combustion model using the input/output data, the model generator comprising a model-type selector enabling selection of a model type among a transfer function model type, a state space model type, and an impulse/step response model type, the selection of the transfer function model type including a selection of an auto-regressive eXogeneous (ARX) model, the selection of the state space model type including a selection of a discrete & delay time state space model in which delay time is considered;
a model simulator configured to simulate the generated boiler combustion model and output simulated results; and
a model modifier configured to evaluate the boiler combustion model based on the simulated results and generate modification information for modifying the boiler combustion model based on the generated boiler combustion model and corresponding evaluated results,
wherein the model generator is further configured to select the state space model as a basic model, and select the ARX model of the transfer function model type together with the discrete & delay time state space model of the state space model type, to improve the basic model.

2. The system according to claim 1, wherein the model generator is further configured to:
generate the boiler combustion model according to the modification information generated by the model modifier;
verifying the boiler combustion model to obtain verified results; and
modifying the boiler combustion model based on the verified results.

3. The system according to claim 1, wherein the model generator further comprises:
a model-number selector configured to select the number of models having the model type selected by the model-type selector;
an input/output design device configured to design inputs and outputs of the boiler combustion models and configure details of the inputs and outputs; and
a modeling device configured to model the boiler combustion model in response to the designed inputs and outputs.

4. The system according to claim 1,
wherein the selection of the transfer function model type further includes a selection of at least one of a nonlinear ARX (NARX) model, a finite impulse response (FIR) model, an auto-regressive moving average eXogeneous (ARMAX) model, and a neural network (NN) model,
wherein the selection of the state space model type further includes a selection of at least one of a linear time invariant (LTI) state space model and a multi input multi output (MIMO) state space model, and
wherein the selection of the impulse/step response model type includes a selection of at least one of an impulse response model, a step response model, and a frequency transfer function model.

5. The system according to claim 4, wherein the selection of the NN model includes a selection of at least one of a feed forward (FF) NN model, a Fischer-Burmeister (FB) function NN model, a radial basis function (RBF) NN model, a convolutional spiking NN model, a deep belief network (DBN) model, and a recurrent NN (RNN) model.

6. The system according to claim 3, wherein the input/output design device designs input/output for each output and model through tag analysis.

7. The system according to claim 3,
wherein the boiler combustion model reflecting the input and output follows Equation 1, $$x_3(k) = a_1 x_1(k-d_1)^{b_1} + a_2 x_2(k-d_2)^{b_2} + c \qquad \text{Equation 1}$$

where $x_3(k)$ is an output value, $x_1$, $x_2$ are an input value, and $a_1$, $a_2$, k, $d_1$, $d_2$, $b_1$, $b_2$, and c are constants,
wherein the input/output design device designs the constants of $a_1$, $a_2$, k, $d_1$, $d_2$, $b_1$, $b_2$, and c.

8. The system according to claim 1, wherein the model modifier comprises:
a performance evaluator configured to evaluate the boiler combustion model based on an output value of the boiler combustion model; and
a modification controller configured to generate modification information for modifying the boiler combustion model based on the evaluated result by the performance evaluator.

9. A method of configuring a boiler combustion model, the method comprising:
generating, using a boiler of a power plant under operation, input/output data based on measured data, analysis data, and combustion controller information, the measured data including data measured in the boiler and obtained before, during, and after boiler combustion, the analysis data obtained by analyzing the measured data in real time, the combustion controller information including controller type, control gain, control delay time, and a control target value for combustion optimization;
generating a boiler combustion model using the input/output data;
selecting a model type among a transfer function model type, a state space model type, and an impulse/step response model type, the selection of the transfer function model type including a selection of an autoregressive eXogeneous (ARX) model, the selection of the state space model type including a selection of a discrete & delay time state space model in which delay time is considered;
simulating the generated boiler combustion model and outputting simulated results; and
evaluating the boiler combustion model based on the simulated results and generating modification information for modifying the boiler combustion model based on the generated boiler combustion model and corresponding evaluated results,
wherein the model type selecting includes
selecting the state space model as a basic model, and
selecting the ARX model of the transfer function model type together with the discrete & delay time state space model of the state space model type, to improve the basic model.

10. The method according to claim 9, wherein the generating the boiler combustion model comprises generating the boiler combustion model according to the generated modification information.

11. The method according to claim 9, wherein the generating the boiler combustion model comprises:
selecting the number of models having the selected model type;
designing inputs and outputs of the boiler combustion models and configuring details of the inputs and outputs; and
modeling the boiler combustion model in response to the designed inputs and outputs.

12. The method according to claim 9,
wherein the selection of the transfer function model type further includes a selection of at least one of a nonlinear ARX (NARX) model, a finite impulse response (FIR) model, an auto-regressive moving average eXogeneous (ARMAX) model, and a neural network (NN) model,
wherein the selection of the state space model type further includes a selection of at least one of a linear time invariant (LTI) state space model and a multi input multi output (MIMO) state space model, and
wherein the selection of the impulse/step response model type includes a selection of at least one of an impulse response model, a step response model, and a frequency transfer function model.

13. The method according to claim 12, wherein the selection of the NN model includes a selection of at least one of a feed forward (FF) NN model, a Fischer-Burmeister (FB) function NN model, a radial basis function (RBF) NN model, a convolutional spiking NN model, a deep belief network (DBN) model, and a recurrent NN (RNN) model.

14. The method according to claim 11, wherein the designing inputs and outputs of the boiler combustion models comprises designing the input/output for each output and model through tag analysis.

15. The method according to claim 11,
wherein the boiler combustion model reflecting the input and output follows Equation 1, $$x_3(k)=a_1 x_1(k-d_1)^{b_1}+a_2 x_2(k-d_2)^{b_2}+c \qquad \text{Equation 1}$$

where $x_3(k)$ is an output value, $x_1$, $x_2$ are an input value, and $a_1$, $a_2$, k, $d_1$, $d_2$, $b_1$, $b_2$, and c are constants,
wherein the input/output design device designs the constants of $a_1$, $a_2$, k, $d_1$, $d_2$, $b_1$, $b_2$, and c.

16. The method according to claim 9, wherein the generating the modification information comprises:
evaluating the boiler combustion model based on an output value of the boiler combustion model; and
generating modification information for modifying the boiler combustion model based on the evaluated result.

17. A non-transitory computer readable storage medium storing a computer program comprising instructions for performing the method of configuring the boiler combustion model according to claim 9.

18. A system for optimizing a boiler combustion, the system comprising:
an automatic modification manager configured to determine a combustion model and a combustion controller based on tag data information measured in real time, determine whether to perform combustion optimization, and determine whether to perform learning for modifying the combustion model and the combustion controller;
a data preprocessor configured to perform data preprocessing using the tag data information and data information of a tag previously stored;
a data analyzer configured to perform sampling to select data required for design of the combustion model and the combustion controller through pattern analysis of the data, and select an input variable through correlation analysis for the design of the combustion model;
a boiler combustion model designing system configured to design the combustion model based on an input of fuel input, an air input, an air temperature, or a water input;
a boiler combustion controller designing system configured to design the combustion controller using the combustion model to generate an optimal target value for optimal combustion control;
an optimal model/controller selector configured to select the most optimal combustion model and the combustion controller from a plurality of existing combustion models and combustion controllers obtained based on an analysis result of current data; and a boiler combustion optimizing system configured to calculate the optimal target value by inputting the current data to the optimal combustion model and the combustion controller, wherein the boiler combustion model designing system comprises:
- a boiler of a power plant under operation, the power plant configured to generate input/output data based on measured data, analysis data, and combustion controller information, the measured data including data measured in the boiler and obtained before, during, and after boiler combustion, the analysis data obtained by analyzing the measured data in real time, the combustion controller information including controller type, control gain, control delay time, and a control target value for combustion optimization;
- a model generator configured to generate the boiler combustion model using the input/output data, the model generator comprising a model-type selector enabling selection of a model type among a transfer function model type, a state space model type, and an impulse/step response model type, the selection of the transfer function model type including a selection of an auto-regressive eXogeneous (ARX) model, the selection of the state space model type including a selection of a discrete & delay time state space model in which delay time is considered;
- a model simulator configured to simulate the generated boiler combustion model and output simulated results; and
- a model modifier configured to evaluate the boiler combustion model based on the simulated results and generate modification information for modifying the boiler combustion model based on the generated boiler combustion model and corresponding evaluated results, wherein the model generator is further configured to select the state space model as a basic model, and select the ARX model of the transfer function model type together with the discrete & delay time state space model of the state space model type, to improve the basic model.

19. The system according to claim 18, wherein the automatic modification manager executes the boiler combustion model designing system and the boiler combustion controller designing system in response to determining that the combustion model and the combustion controller are required to be modified.

20. The system according to claim 18, wherein the model generator further comprises:
- a model-number selector configured to select the number of models having the model type selected by the model-type selector;
- an input/output design device configured to design inputs and outputs of the boiler combustion models and configure details of the inputs and outputs; and
- a modeling device configured to model the boiler combustion model in response to the designed inputs and outputs.

* * * * *